United States Patent
Hatamoto et al.

(10) Patent No.: US 7,944,017 B2
(45) Date of Patent: May 17, 2011

(54) SEMICONDUCTOR DEVICE AND MANUFACTURING METHOD OF THE SAME

(75) Inventors: Mitsuo Hatamoto, Gunma (JP); Yoshiaki Matsumiya, Gunma (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 331 days.

(21) Appl. No.: 12/186,345

(22) Filed: Aug. 5, 2008

(65) Prior Publication Data

US 2009/0039398 A1    Feb. 12, 2009

(30) Foreign Application Priority Data

Aug. 8, 2007 (JP) .................. 2007-207056

(51) Int. Cl.
*H01L 21/70* (2006.01)
*H01L 29/66* (2006.01)
*H01L 21/337* (2006.01)

(52) U.S. Cl. ........ 257/504; 257/134; 257/139; 257/256; 257/272; 257/E29.014; 257/E29.063; 257/E29.127; 257/E29.255; 257/E29.265; 257/E29.312; 257/E29.314; 257/E21.403; 257/E21.408; 438/186

(58) Field of Classification Search .................. 257/134, 257/272, 139, E29.014, E29.063, E29.116, 257/E29.127, E29.312, E29.255, 256, 504, 257/E29.265, E29.314, E21.403, E21.408; 438/186

See application file for complete search history.

(56) References Cited

U.S. PATENT DOCUMENTS

| | | | |
|---|---|---|---|
| 6,306,691 B1 * | 10/2001 | Koh | 438/149 |
| 2004/0065896 A1 * | 4/2004 | Sakamoto | 257/134 |
| 2009/0168508 A1 * | 7/2009 | Kapoor et al. | 365/177 |

FOREIGN PATENT DOCUMENTS

| | | |
|---|---|---|
| JP | 60-92659 | 5/1985 |
| JP | 5-315549 | 11/1993 |
| JP | 8-227900 | 9/1996 |
| JP | 2002-190480 | 7/2002 |

OTHER PUBLICATIONS

Korean Office Action dated Jun. 1, 2010, directed to counterpart Korean Application No. 10-2008-0075981; 2 pages.

* cited by examiner

*Primary Examiner* — Long K Tran
(74) *Attorney, Agent, or Firm* — Morrison & Foerster LLP (57) ABSTRACT

An n type impurity region is continuously formed on the bottom portion of a channel region below a source region, a gate region and a drain region. The n type impurity region has an impurity concentration higher than the channel region and a back gate region, and is less influenced by the diffusion of p type impurities from the gate region and the back gate region. Moreover, by continuously forming the impurity region from a portion below the source region to a portion below the drain region, the resistance value of a current path in the impurity region is substantially uniformed. Therefore, the IDSS is stabilized, the forward transfer admittance gm and the voltage gain Gv are improved, and the noise voltage Vno is decreased. Furthermore, the IDSS variation within a single wafer is suppressed.

6 Claims, 6 Drawing Sheets

Prior Art

Fig.11

Prior Art

SEMICONDUCTOR DEVICE AND MANUFACTURING METHOD OF THE SAME

This application claims priority from Japanese Patent Application Number JP 2007-207056 filed on Aug. 8, 2007, the content of which is incorporated herein by reference in its entirety.

BACKGROUND OF THE INVENTION

1. Field of the Invention

The present invention relates to a semiconductor device employed in a high-frequency device, and a manufacturing method for the same, and particularly to a semiconductor device in which a variation in a saturated drain-source current (IDSS) and a noise are reduced, and a manufacturing method for the same.

2. Description of the Related Art

Figure 10:
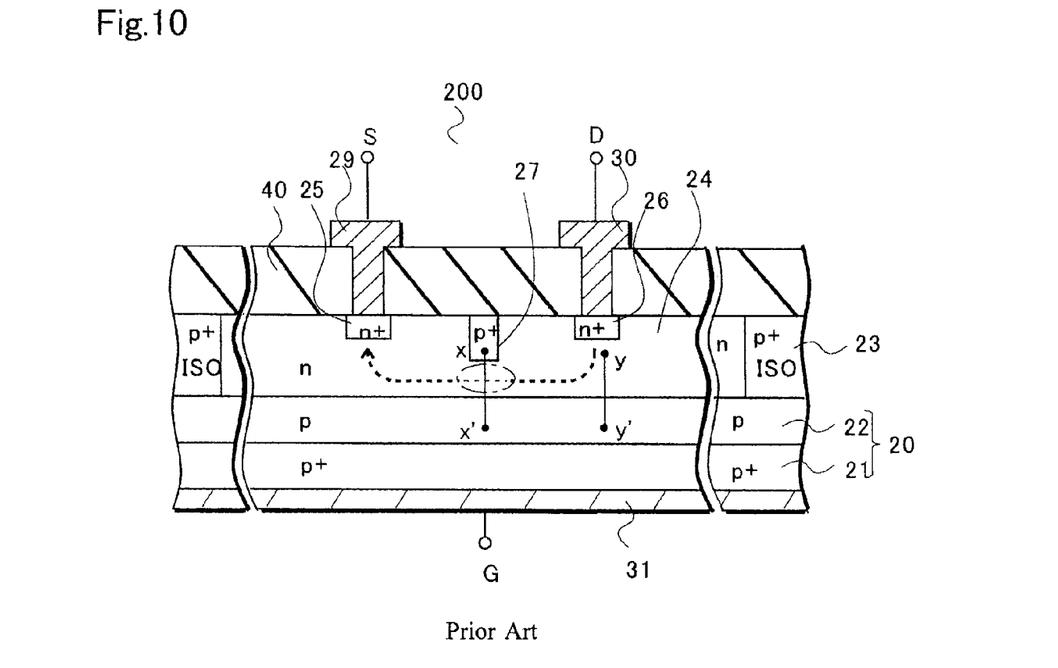
FIG. 10 is a cross-sectional view for describing a conventional structure.

FIG. 10 is a cross-sectional view for showing an example of a conventional junction field effect transistor (J-FET) 200 employed in a high-frequency device.

A semiconductor substrate 20 is formed by depositing a p type semiconductor layer 22 on a p type silicon semiconductor substrate 21, for example. A channel region 24 is formed on the surface of the semiconductor substrate 20. The channel region 24 is an n type semiconductor layer defined by an isolation region 23 that is a p type impurity region of high concentration. A source region 25 and a drain region 26 are formed in the n type channel region 24. A gate region 27 is formed between the source region 25 and the drain region 26.

The source region 25, the drain region 26 and the gate region 27 are, for example, formed into a stripe-shape in a plan view.

Moreover, a source electrode 29 and a drain electrode 30 are formed on, and are connected to, the source region and the drain region, respectively. A gate electrode 31 is formed on the back surface of the semiconductor substrate 21 that serves as a back gate region, and the gate electrode 31 is connected to the gate region. (This technology is described, for instance, in Japanese Patent Application Publication No. Hei 08-227900, FIG. 6 on page 2.)

As shown in FIG. 10, when the J-FET 200 is in ON state, a portion of the channel region 24 from the drain region 26 to the source region 25 via a region below the gate region 27 serves as a current path (dotted arrow). The IDSS is determined on the basis of the width and impurity concentration of the portion in the channel region 24 right below the gate region 27.

The gate region 27 is a diffusion region of a high-concentration p type impurity having an impurity concentration of approximately $1.0\,\mathrm{E}\,18\,\mathrm{cm}^{-3}$. The impurity concentration of the channel region 24 is approximately $1.0\,\mathrm{E}\,15\,\mathrm{cm}^{-3}$. Accordingly, the p type impurity in the gate region 27 diffuses into the channel region 24 having a lower impurity concentration; the n type impurity concentration is decreased in the portion right below the gate region 27 (shown by a dashed-dotted-line circle) in the channel region 24. Moreover, the p type impurity in the p type semiconductor layer 22 that serves as the back gate region expands upward to the channel region 24 as well. As a result, the n type impurity concentration of the portion in the channel region 24 right below the gate region 27 is decreased.

Figure 11:
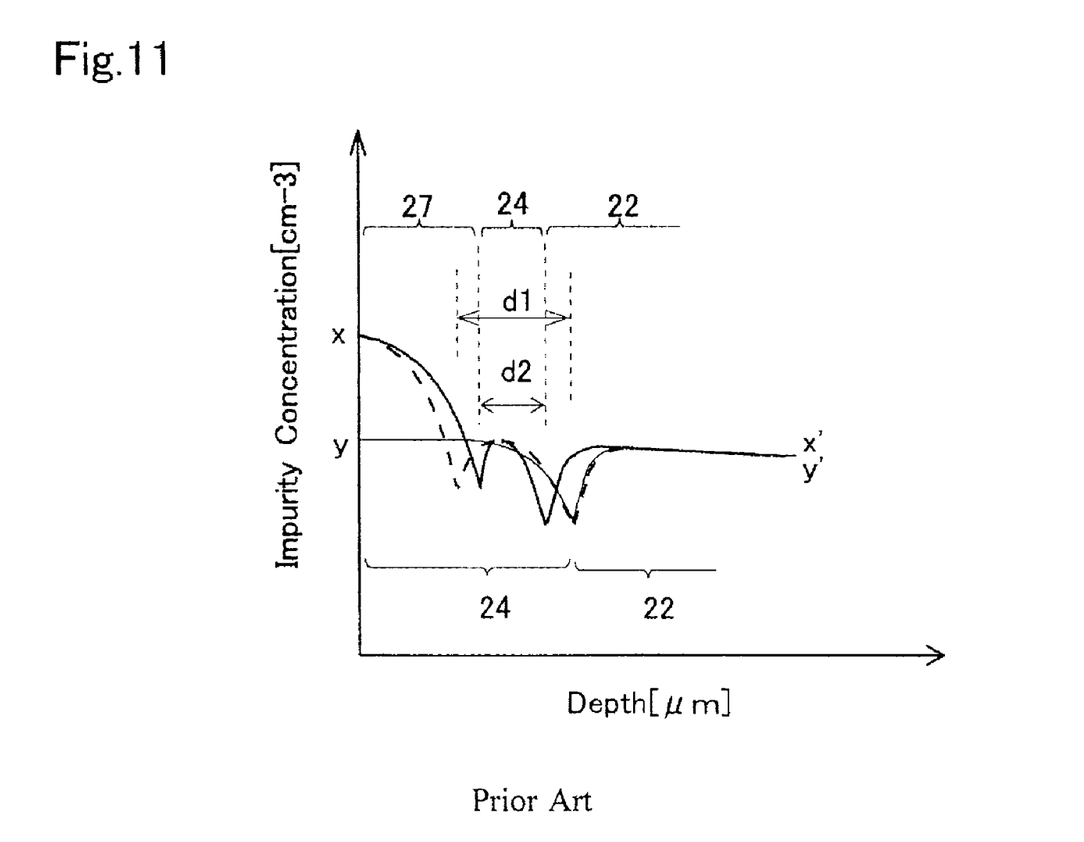
FIG. 11 is a characteristic diagram for describing the conventional structure.

FIG. 11 shows impurity concentration profiles in cross sections taken along lines x-x' and y-y' of FIG. 10.

A solid bold line indicates the impurity concentration profile of the gate region 27, the channel region 24 and the p type semiconductor layer 22 in a case where the p type impurity is excessively diffused. A broken line indicates the impurity concentration profile in a case where the p type impurity is not excessively diffused. A thin line indicates the impurity concentration profile of the channel region 24 and the p type semiconductor layer 22 that are positioned below the drain region 26.

In short, a width d1 is secured for the portion, having a predetermined impurity concentration, in the channel region 24 right below the gate region 27 in the case where the p type impurity is not excessively diffused (broken line). However, the excessive diffusion of the p type impurity (solid line) substantially reduces the width of the portion in the channel region 24 right below the gate region 27, to a width d2.

The impurity concentration profile indicated by the line y-y' of FIG. 10 does not vary as shown by the thin solid line. Accordingly, when the p type impurity excessively diffused, the current path, particularly right below the gate region 27, is narrowed in comparison with the case where the p type impurity is not excessively diffused. Thus, the IDSS resistance value is increased.

The degree of variation in such impurity diffusion varies even within a single wafer. The variation results in production of a chip in which the p type impurity excessively diffused, and a chip in which the p type impurity is not so diffused. This causes a problem that the IDSS varies among the J-FETs 200 within the single wafer. Especially, if the channel region 24 is formed by impurity implantation and diffusion, the formation itself will cause a variation in the diffusion, thus resulting a noticeable variation in the IDSS within a single wafer. As a result, a large number of chips produced are out of standards.

Furthermore, the resistance value of the current path right below the gate region is drastically increased. Thereby, there arises a problem of characteristic deteriorations such as a deterioration of a forward transfer admittance gm and a voltage gain Gv, and an increase of a noise voltage Vno.

On the other hand, the increase in the impurity concentration of the channel region allows the channel region to be less influenced by the diffusion of the p type impurity from the p type semiconductor layer that serves as the gate region or the back gate region.

However, the high concentration in the channel region means the increase in the impurity concentration around a side surface of the gate region as well. To put it another way, when a source-gate reverse bias voltage (VGSO) is applied, a depletion layer spreads insufficiently. Accordingly, a predetermined breakdown voltage cannot be secured.

SUMMARY OF THE INVENTION

The invention provides a semiconductor device that includes a semiconductor substrate of a first general conductivity type configured to operate as a back gate region, a channel region of a second general conductivity type disposed on the semiconductor substrate, a source region and a drain region of the second general conductivity type formed in a surface portion of the channel region, a gate region of the first general conductivity type formed between the source region and the drain region in the surface portion of the channel region, and an impurity region of the second general conductivity type disposed between the semiconductor substrate and the channel region so as to be located below the gate electrode, an impurity concentration of the impurity region being higher than an impurity concentration of the channel region.

The invention also provides a method of manufacturing a semiconductor device. The method includes providing a semiconductor substrate of a first general conductivity type, forming an impurity region of a second general conductivity type in a surface portion of the semiconductor substrate, forming a semiconductor layer of the second general conductivity type on the impurity region, forming an isolation region in the semiconductor layer so as to penetrate the semiconductor layer to reach the semiconductor substrate, the isolation region defining a channel region made of the semiconductor layer disposed on the impurity region, forming a gate region of the first general conductivity type in a surface portion of the channel region, forming a source region and a drain region of the second general conductivity type in the surface portion of the channel region, and configuring the semiconductor substrate to operate as a back gate.

DESCRIPTION OF THE INVENTIONS

Hereinafter, descriptions will be given of preferred embodiments of the present invention with reference to FIGS. 1 to 9, taking a junction field effect transistor (J-FET) as an example.

Figure 1A:
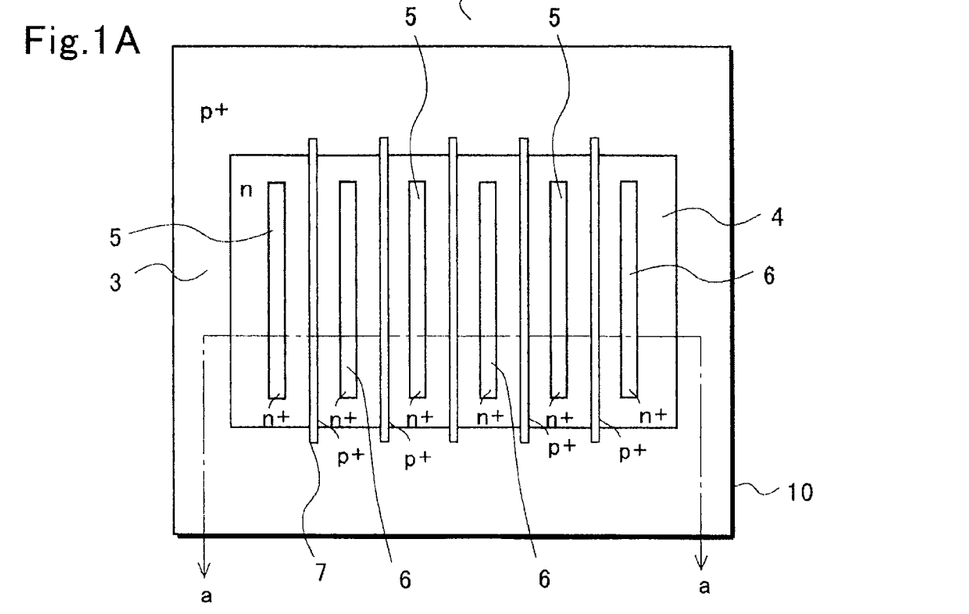
FIG. 1A and FIG. 1B are plan views for describing a preferred embodiment of the present invention.
Figure 1B:
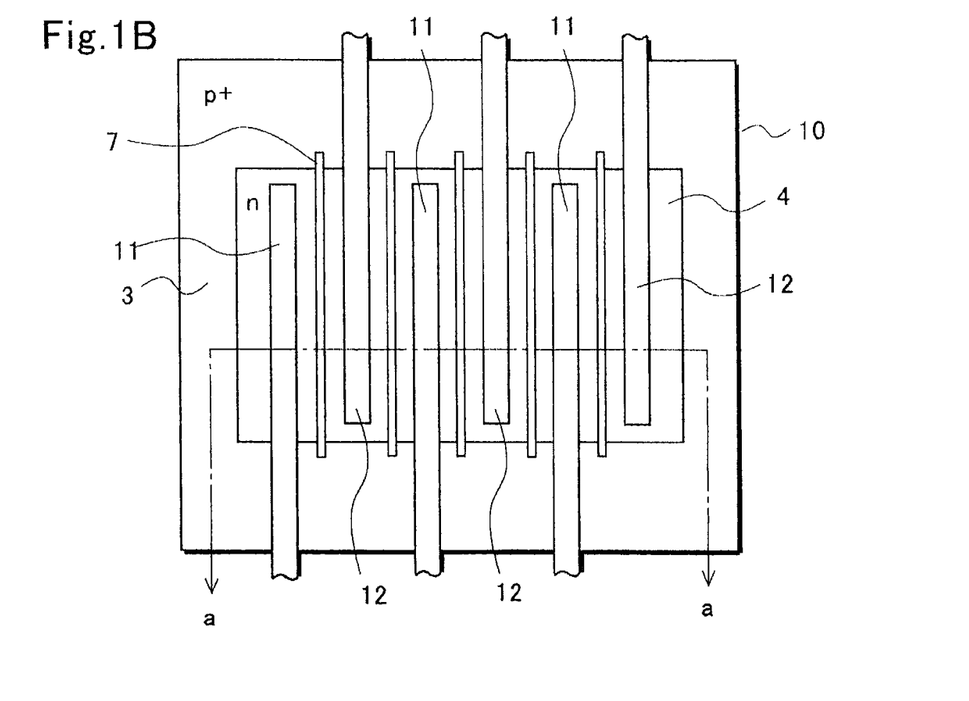
Figure 2:
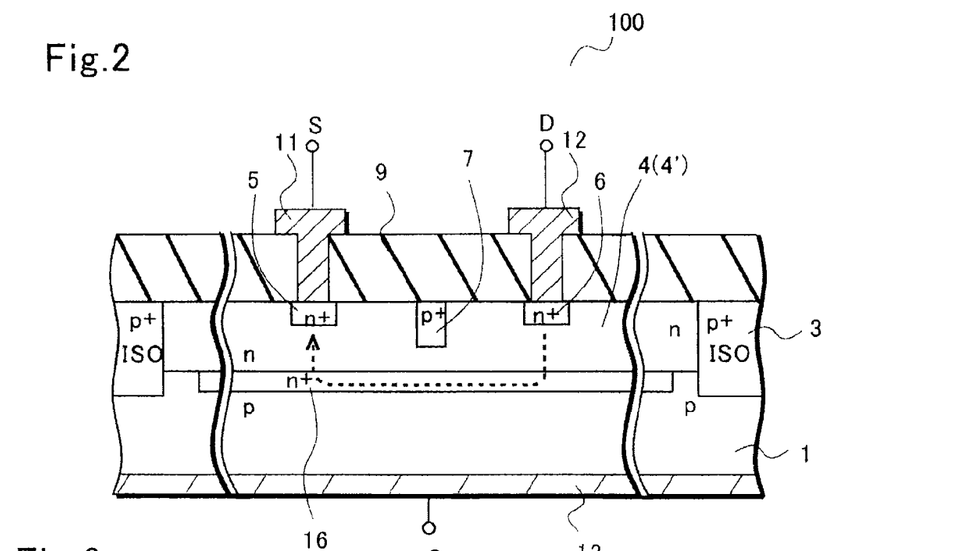
FIG. 2 is a cross-sectional view for describing the preferred embodiment of the present invention.
Figure 3:
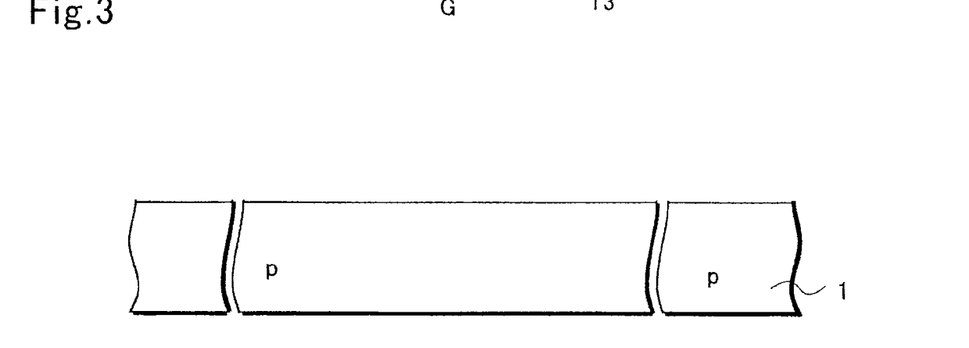
FIG. 3 is a cross-sectional view for describing a manufacturing method according to a preferred embodiment of the present invention.

FIG. 1A and FIG. 1B are plan views illustrating a part of a J-FET 100. Specifically, FIG. 1A is the view in which an electrode layer is omitted, and FIG. 2 is the view in which the electrode layer is disposed.

The J-FET 100 according to this embodiment includes: a semiconductor substrate 1 of a first general conductivity type (for example, p−, p and p+); a channel region 4; gate regions 7; source regions 5; drain regions 6; and an impurity region 16 of a second general conductivity type (for example, n−, n and n+).

In the J-FET 100, as shown in FIG. 1A, the single channel region 4 defined by an isolation region 3 is provided on the p type semiconductor substrate 1 which constitutes one chip, and which serves as a back gate region. Nevertheless, the channel region 4 may be provided in multiple.

The isolation region 3 is a p type impurity region of high concentration. As shown in a cross-sectional view (FIG. 2) to be described later, the isolation region 3 penetrates the n type channel region 4, and reaches the p type semiconductor substrate 1.

The p type gate regions 7 are disposed in the surface of the channel region 4. The gate regions 7 are formed in a stripe shape.

The gate region 7 extends to and in contact with the isolation region 3 that is the p type impurity region around the channel region 4. In other words, the gate regions 7 are connected to the back gate region (p type semiconductor substrate 1) with the isolation region 3.

The n type source regions 5 and drain regions 6 are disposed in stripe shapes on the respective side portions of the gate regions 7.

As shown in FIG. 1B, source electrodes 11 and drain electrodes 12 are formed in stripe shapes, and are superposed on the source regions 5 and the drain regions 6, respectively. The source electrodes 11 and the drain electrodes 12 are connected to the source regions 5 and the drain regions 6 through contact holes formed in an insulating film (unillustrated) that covers the surface of the channel region 4.

Although unillustrated, each group of the source electrodes 11 and the drain electrodes 12 is disposed on the channel region 4, and bundled with wires into comb-teeth shapes. The comb-teeth of the source electrodes 11 and the drain electrodes 12 engage with each other, and the source electrodes 11 and the drain electrodes 12 are connected to source pad electrodes and drain pad electrodes (unillustrated), respectively.

FIG. 2 is the cross-sectional view taken along a line a-a of FIG. 1. In cross-sectional views to be described hereinafter, shown will be one cell which is a set of the source region 5, the gate electrode 7 and the drain region 6, and which is on the channel region 4.

The p type semiconductor substrate 1 which serves as the back gate region is a p type silicon semiconductor substrate (whose impurity concentration is, for example, approximately $4\,E\,15\,cm^{-3}$.) The channel region 4 is an n type semiconductor layer 4' formed by epitaxial growth or the like. The impurity concentration thereof is, for example, approximately $1.0\,E\,15\,cm^{-3}$. The channel region 4 may be formed by implanting and diffusing ions of an n type impurity into the surface of the p type semiconductor substrate 1.

The n type semiconductor layer 4' is divided to have an island form by the isolation region 3 that reaches the p type semiconductor substrate 1. The divided region is defined as the channel region 4.

The gate region 7 is formed in the surface of the channel region 4, and is a diffusion region of the p type impurity. The preferable impurity concentration of the gate region 7 is approximately $1\,E\,18\,cm^{-3}$.

As described above, the gate region 7 is electrically connected, with the isolation region 3 and the p type semiconductor substrate 1, to a gate electrode 13 that is provided to the back surface of the p type semiconductor substrate 1.

The source region 5 and the drain region 6 are regions formed by implanting and diffusing n type impurities into the surface of the channel region 4. The source region 5 and the drain region 6 are disposed in the strip shape on the respective side portions of the gate region 7.

An insulating film 9 is formed on the surface of the p type semiconductor substrate 1. The source electrode 11 and the drain electrode 12 of the stripe shapes are formed in the insulating film 9, and are superposed on the source region 5 and the drain region 6, respectively. The source electrode 11 and the drain electrode 12 are in contact with the source region 5 and the drain region 6, respectively, through the contact holes formed in the insulating film 9.

The n type impurity region 16 is formed at least on the bottom portion of the channel region 4, the portion being right below the gate region 7. The impurity concentration of the n type impurity region 16 is set so as not to be influenced by the diffusion of the p type impurity from the gate region 7 and by the upward expansion of the p type impurity from the back gate region (the p type semiconductor substrate 1). Specifically, the impurity concentration is, for example, approximately $1\,\mathrm{E}\,17\,\mathrm{cm}^{-3}$, and higher than that of the channel region 4.

The n type impurity region 16 is continuously formed within the range of single channel region 4 as nearly reaching the isolation region 3. If the n type impurity region 16 is brought into contact with the isolation region 3, a depletion layer is suppressed from extending at the intersection. This causes the breakdown voltage characteristic to be deteriorated. For this reason, an edge of the n type impurity region 16 is apart from the isolation region 3 at a distance of, for example, approximately 2 μm to 3 μm.

Alternatively, two or more n type impurity regions 16 may be each continuously formed on the bottom portion of the single channel region 4 within the range of the single cell, that is, below a portion from the source region 5 to the drain region 6 via the gate region 7.

In the conventional structure (FIG. 10), the channel region 24 has a lower impurity concentration (for example, approximately $1\,\mathrm{E}\,15\,\mathrm{cm}^{-3}$), and the gate region 27 has a higher impurity concentration (approximately $1\,\mathrm{E}\,18\,\mathrm{cm}^{-3}$). Accordingly, the p type impurity in the gate region 27 diffuses into the portion in the channel region 24 right below the gate region 27 and the diffusion causes the n type impurity concentration in the channel region 24 to be decreased.

As described above, when the J-FET is in ON state, the current path is formed from the drain region 26 to the source region 25 via the region below the gate region 27 (FIG. 10: dotted arrow). Nevertheless, the decrease in the n type impurity concentration of the portion in the channel region 24 right below the gate region 27 causes an increase of the resistance value of the current path right below the gate region 27. To put it another way, a region having a low resistance value and a region having a high resistance value are formed in the current path, thereby the IDSS varies, and the electrons flow ununiformly. This is one factor of worsening the noise voltage Vno.

Moreover, even within the single wafer, the p type impurity does not always influence the portion in the channel region 24 right below the gate region 27 in the same manner, due to the variation in the diffusion from the gate region 27 itself and the variation in the diffusion of the p type impurity into the channel region 24.

In other words, the conventional structure has not only the problem of the increased resistance value due to the narrowing of the current path, but also the problem of the IDSS variation within the single wafer.

Furthermore, the increase in the resistance value leads to the problems of: an increase in the noise voltage Vno; a decrease in the forward transfer admittance gm; and a decrease in the voltage gain Gv.

The increase in the impurity concentration of the channel region 24 reduces the influence by the diffusion of the p type impurity. Nevertheless, this is not preferable because the breakdown voltage characteristic is deteriorated.

In this embodiment, the n type impurity region 16 of high impurity concentration is disposed so as to abut on the bottom portion of the n type channel region 4. Thereby, the n type impurity region 16 is utilized as the current path as shown by a dotted arrow in FIG. 2.

To be more specific, even when the n type impurity concentration of a portion in the channel region 4 right below the gate region 7 is decreased, the n type impurity region 16 is less influenced by this. Moreover, the impurity concentration of the n type impurity region 16 is higher than the impurity concentration ($4.0\,\mathrm{E}\,15\,\mathrm{cm}^{-3}$) of the p type semiconductor substrate 1 that is the back gate region. Thus, the n type impurity region 16 is less influenced by the upward expansion of the p type impurity from the p type semiconductor substrate 1.

Therefore, the n type impurity region 16 of high concentration serving as the current path is disposed on the bottom portion of the channel region 4, and this makes it possible to have substantially uniform changes in the resistance value of the current path that is positioned from the portion below the drain region 6 to the portion below the source region 5.

Moreover, the impurity concentration of the channel region 4 is maintained to be as low as that in the conventional structure. Thereby, when the J-FET 100 is turned off, the depletion layer is sufficiently expanded around gate region 7 that influences a gate-source voltage VGS. Accordingly, the breakdown voltage is secured.

Note that, when the J-FET 100 is turned off, the depletion layer that has extended below the gate region 7 also expands into the n type impurity region 16, exhibiting pinch-off. Although it is harder for the depletion layer to expand into the n type impurity region 16 than into the channel region 4, the thickness of the impurity region 16 is 0.2 μm or less. This is large enough to exhibit the pinch-off.

Accordingly, the change in the resistance value of the current path in the J-FET 100 is reduced, and a stable IDSS is obtained. Moreover, even when a chip having the p type impurity excessively diffused therein and a chip having no p type impurity excessively diffused are produced within the single wafer, that IDSS values are substantially uniform. Thereby, the IDSS variation is reduced among the multiple J-FETs 100.

Additionally, the current path from the portion below the source region 5 to the portion below the drain region 6 is the n type impurity region 16 whose impurity concentration is substantially uniform, and whose resistance is low. Accordingly, the resistance values in the majority portion of the current path in the J-FET are substantially uniformed. Thereby, the electrons flow substantially uniformly so that the noise voltage Vno is decreased. Furthermore, the IDSS is stabilized, and the forward transfer admittance gm and the voltage gain Gv are improved.

Note that the n type impurity region 16 may be formed only right below the gate region 7. Nevertheless, in order to obtain a stable IDSS, it is preferable to form a pattern in which the impurity region 16 is continuously formed on the bottom portion of the channel region 4 below the source region 5, the gate region 7 and the drain region 6 to serve as the current path.

Next, description will be given of a method for manufacturing a J-FET 100 according to this embodiment with reference to FIGS. 3 to 9.

First step (FIG. 3): A p type semiconductor substrate 1 which serves as a back gate region is prepared. The impurity concentration of the p type semiconductor substrate 1 is, for example, approximately $4\,\mathrm{E}\,15\,\mathrm{cm}^{-3}$.

Second step (FIG. 4): An insulating film (for example, an oxide film) 9' is formed on the surface of the back gate region, and an opening is formed at a predetermined position of the insulating film 9'. Ions of an n type impurity are selectively implanted (implanting energy: 20 KeV). The impurity is for example phosphorus ($P^+$). Then, a heat treatment is conducted to diffuse the n type impurity, and thereby an n type impurity region 16 is formed. The impurity concentration of the n type impurity region 16 is, for example, approximately $1\,E\,16\,cm^{-3}$. The n type impurity region 16 is formed in a pattern in which the impurity region 16 is continuously formed on the entire surface of the bottom portion of a channel region as nearly reaching an isolation region. The channel region and the isolation region are formed in the subsequent step.

Figure 4:
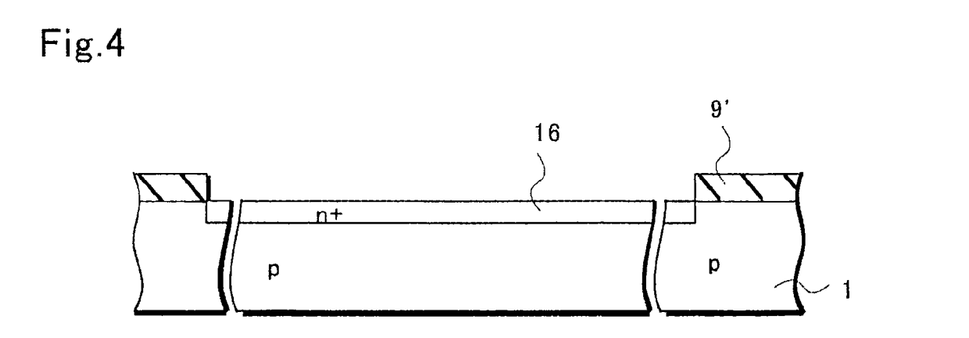
FIG. 4 is a cross-sectional view for describing the manufacturing method according to the preferred embodiment of the present invention.
Figure 5:
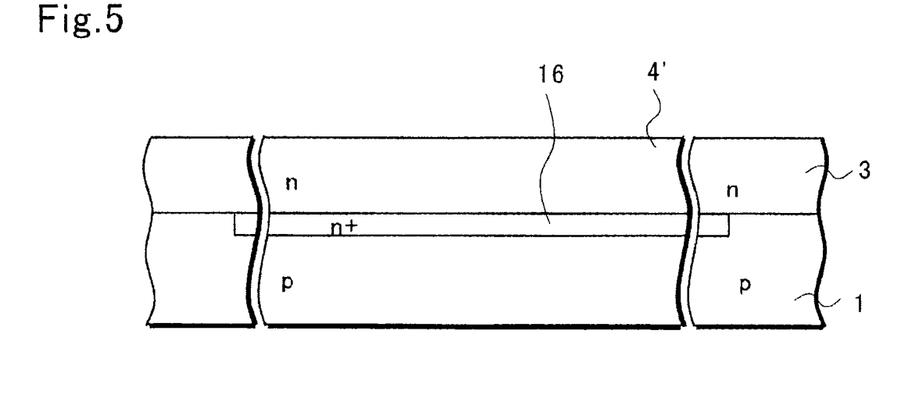
FIG. 5 is a cross-sectional view for describing the manufacturing method according to the preferred embodiment of the present invention.

Alternatively, two or more n type impurity regions 16 may be continuously formed on the bottom portion of the single channel region 4 within the range of a single cell, that is, from a portion below a source region 5 to a portion below a drain region 6 via a portion below a gate region 7.

Third step (FIG. 5): The insulating film 9' serving as the mask is removed. An n type semiconductor layer 4' is formed by, for example, epitaxial growth or the like on the entire surface of the resulting substrate 1. The n type semiconductor layer 4' is formed above the back gate region and on the n type impurity region 16. The impurity concentration of the n type semiconductor layer 4' is approximately $1.0\,E\,15\,cm^{-3}$.

Fourth step (FIG. 6): A mask (unillustrated) having an opening at a desired position is disposed on the entire surface. Ions of a p type impurity of high concentration (approximately $1\,E\,16\,cm^{-3}$) are implanted and diffused to form an isolation region 3 which penetrates the n type semiconductor layer 4', and which reaches the p type semiconductor substrate 1.

Figure 6:
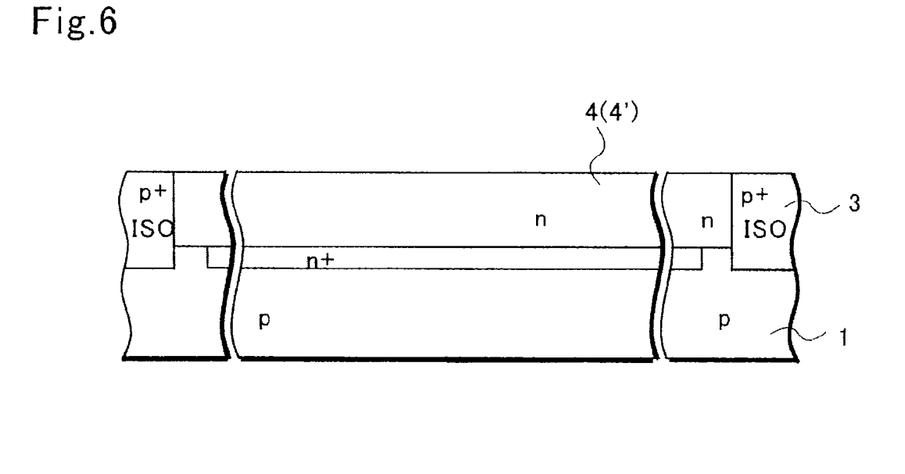
FIG. 6 is a cross-sectional view for describing the manufacturing method according to the preferred embodiment of the present invention.

The n type semiconductor layer 4' is divided into multiple sections by the isolation region 3, and thereby the channel regions 4 are formed. A part of the bottom portion of the channel region 4 abuts on the n type semiconductor region 16.

Figure 7:
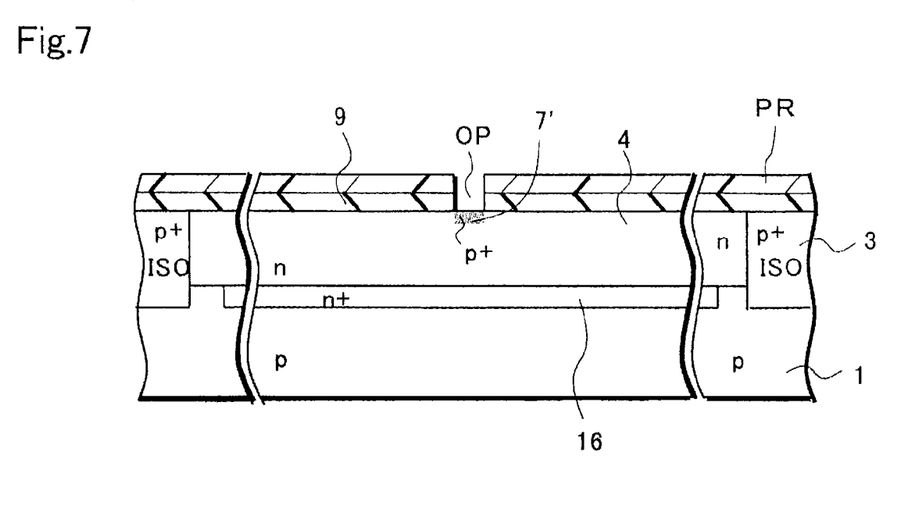
FIG. 7 is a cross-sectional view for describing the manufacturing method according to the preferred embodiment of the present invention.
Figure 8A:
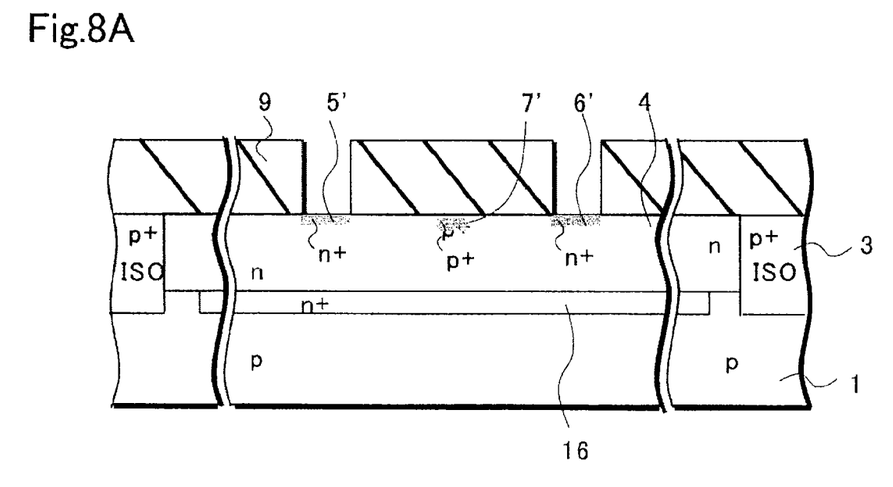
FIG. 8A and FIG. 8B are cross-sectional views for describing the manufacturing method according to the preferred embodiment of the present invention.

Fifth step (FIG. 7 to FIG. 8B): Again, an insulating film (oxide film) 9 is formed on the entire surface so that the insulating film 9 can have a thickness of approximately 4000 Å. A photoresist (PR) is formed as a mask in which only an opening portion OP is exposed. The opening portion OP is formed above an area where the gate region 7 is to be formed.

Ions of a p type impurity are implanted into the entire surface at an implanting energy of 25 KeV, and at a dose of approximately $5\,E\,15\,cm^{-2}$. The ions are for example boron ($B^+$). Thereby, a p type gate impurity implantation region 7' is formed (FIG. 7).

Again, an insulating film 9 is formed on the entire surface. Openings are formed in areas of the insulating film 9 to form the source region and the drain region. Then, ions of an n type impurity are implanted into the entire surface at a dose of $7\,E\,15\,cm^{-2}$, and at an implanting energy of 100 KeV. Thereby, a source impurity implantation region 5' and a drain impurity implantation region 6' are formed (FIG. 8A).

Figure 8B:
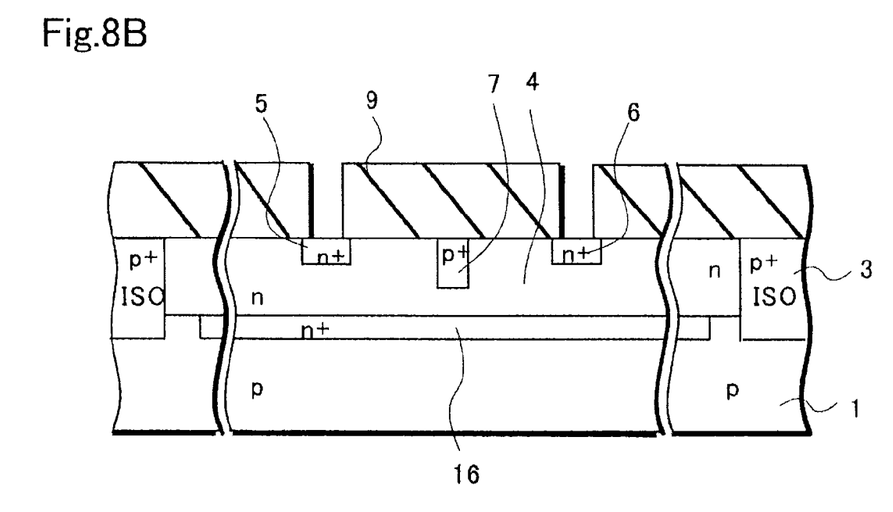
Figure 9:
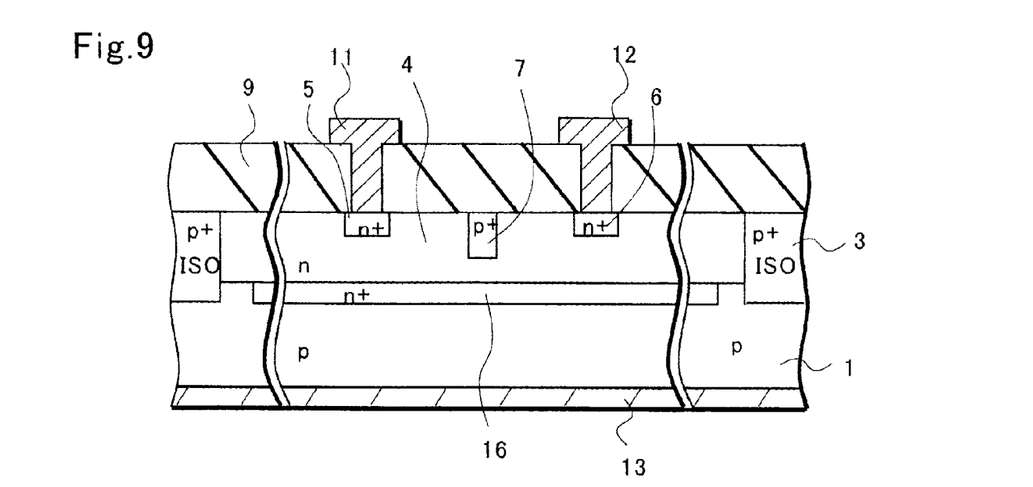
FIG. 9 is a cross-sectional view for describing the manufacturing method according to the preferred embodiment of the present invention.

Subsequently, a heat treatment is conducted (for example, approximately 900° C. and 60 minutes). Thereby, the n type impurities in the source impurity implantation region 5' and the drain impurity implantation region 6' are diffused into the channel region 4, and the source region 5 and the drain region 6 are formed. Simultaneously, the impurity in the gate impurity implantation region 7' is diffused. The source region 5 and the drain region 6 are formed to have an impurity concentration of approximately $4\,E\,19\,cm^{-3}$, respectively.

The n type impurity region 16 is continuously disposed below the source region 5, the gate region 7 and the drain region 6. The impurity region 16 abuts on the bottom portion of the channel region 4.

Sixth step (FIG. 9): Without modifying the insulating film 9 on the top surface of the substrate, a metal such as Al is deposited by vapor deposition. Then, patterning is performed to have a predetermined electrode structure. Thereby, a source electrode 11 and a drain electrode 12 are formed in contact with the source region 5 and the drain region 6, respectively. Moreover, a gate electrode 13 is formed on the back surface of the substrate. The gate electrode 13 is connected to the gate region 7 with the p type semiconductor substrate 1 and the isolation region 3.

According to the preferred embodiments of the present invention, the following numerous effects are obtained.

Firstly, by forming an n type impurity region of high concentration on the bottom portion of a channel region right below a gate region, the n type impurity region is utilized as a current path. The n type impurity region has a higher concentration than that of the channel region. Accordingly, even in a case where the n type impurity concentration in a portion of the channel region right below the gate region is decreased by diffusion of a p type impurity from the gate region, the n type impurity region is less influenced by the decrease. Thereby, the resistance value of the current path is prevented from increasing. Moreover, the n type impurity region is less influenced by the upward expansion of a p type impurity from a p type semiconductor layer that serves as a back gate region, either. Thereby, the impurity concentration in the n type impurity region is substantially uniformly maintained. Therefore, by utilizing the n type impurity region as a portion of the current path (particularly, a portion of the current path right below the gate region), the variation in the change of the resistance value is suppressed, and the variation in the IDSS of a J-FET within a single wafer is reduced.

Secondly, since the n type impurity region is formed on the bottom portion of the channel region, the impurity concentration of the channel region is maintained to be as low as that in the conventional structure. Meanwhile, by increasing the impurity concentration of the channel region, it is possible to reduce the influence by the diffusion of the p type impurity from the gate region or the back gate region. Nevertheless, the increase in the impurity concentration of the channel region around the gate region causes the spreading of a depletion layer to be insufficient. Accordingly, the breakdown voltage is deteriorated.

Against this background, according to the embodiments, the impurity concentration of the channel region around the gate region is maintained at the same concentration as that in the conventional structure. Thereby, a predetermined breakdown voltage is maintained.

Thirdly, by forming the n type impurity region that serves as the part of the current path from a portion below a source region to a portion below a drain region, the resistance values in the majority portion of the current path in the J-FET is substantially uniformed. Thereby, a stable IDSS is obtained.

Furthermore, the noise voltage Vno is decreased, and the forward transfer admittance gm and the voltage gain Gv are improved.

What is claimed is:

1. A semiconductor device comprising:
    a semiconductor substrate of a first general conductivity type configured to operate as a back gate region;
    a channel region of a second general conductivity type disposed on the semiconductor substrate;
    a source region and a drain region of the second general conductivity type formed in a surface portion of the channel region;

a gate region of the first general conductivity type formed between the source region and the drain region in the surface portion of the channel region; and an impurity region of the second general conductivity type disposed between the semiconductor substrate and the channel region so as to be located below the gate electrode, an impurity concentration of the impurity region being higher than an impurity concentration of the channel region, wherein the channel region covers the entire bottom of the source region and the drain region.

2. The semiconductor device of claim 1, wherein the impurity region, in a plan view of the semiconductor device, covers an area between the source region and the drain region.

3. The semiconductor device of claim 1, further comprising an isolation region formed in the channel region to surround the source region and the drain region in a plan view of the semiconductor device, wherein the impurity region, in the plan view, covers the entire area between the source region and the drain region and is not in contact with the isolation region.

4. A method of manufacturing a semiconductor device, comprising:

providing a semiconductor substrate of a first general conductivity type;

forming an impurity region of a second general conductivity type in a surface portion of the semiconductor substrate;

forming a semiconductor layer of the second general conductivity type on the impurity region;

forming an isolation region in the semiconductor layer so as to penetrate the semiconductor layer to reach the semiconductor substrate, the isolation region defining a channel region made of the semiconductor layer disposed on the impurity region;

forming a gate region of the first general conductivity type in a surface portion of the channel region;

forming a source region and a drain region of the second general conductivity type in the surface portion of the channel region so that the channel region covers the entire bottom of the source region and the drain region; and configuring the semiconductor substrate to operate as a back gate.

5. The method of claim 4, wherein the impurity region is formed to cover, in a plan view of the semiconductor substrate, a portion of channel region between the source region and the drain region.

6. The method of claim 4, wherein the impurity region is formed to cover, in a plan view of the semiconductor substrate, the entire portion of channel region between the source region and the drain region and is not in contact with the isolation region.

* * * * *